United States Patent [19]

Hamada et al.

[11] Patent Number: 4,629,928

[45] Date of Patent: Dec. 16, 1986

[54] ELECTRODE TERMINAL STRUCTURE FOR A PIEZOELECTRIC POLYMER

[75] Inventors: Akira Hamada; Hisao Takahashi, both of Iwaki, Japan

[73] Assignee: Kureha Kagaku Kogyo Kabushiki Kaisha, Tokyo, Japan

[21] Appl. No.: 724,680

[22] Filed: Apr. 18, 1985

[30] Foreign Application Priority Data

May 11, 1984 [JP] Japan .............................. 59-67720[U]

[51] Int. Cl.[4] .............................................. H01L 41/08
[52] U.S. Cl. ..................................... 310/365; 310/338; 310/800; 310/331
[58] Field of Search ............... 310/364, 365, 338, 800, 310/330–332

[56] References Cited

U.S. PATENT DOCUMENTS

| 4,216,403 | 8/1980 | Krempl et al. | 310/800 X |
| 4,304,126 | 12/1981 | Yelke | 310/800 X |
| 4,413,202 | 11/1983 | Krempl et al. | 310/800 X |

*Primary Examiner*—Mark O. Budd
*Attorney, Agent, or Firm*—Wenderoth, Lind and Ponack

[57] ABSTRACT

An electrode terminal structure for a polymer piezoelectric element is provided. The polymer piezoelectric element comprises a polymer piezoelectric film and a pair of electrode films formed on both sides of the piezoelectric film. A conductor plate and an insulating plate are successively disposed at a part near the periphery on one surface of the polymer piezoelectric film element. The thus stacked part is sandwiched between a double-layered conductor plate and the entire stacked structure is pressure bonded to form the above-mentioned electrode terminal structure.

10 Claims, 8 Drawing Figures

ELECTRODE TERMINAL STRUCTURE FOR A PIEZOELECTRIC POLYMER

BACKGROUND OF THE INVENTION

The present invention relates to an electrode terminal structure for a piezoelectric film element giving a good and tenacious bonding structure.

Recently, a piezoelectric film or sheet element comprising a single layer or plural layers of polymer piezoelectric film of, for example, a vinylidene fluoride resin, and a pair of electrode films disposed on both sides of the polymer piezoelectric film, has been widely used as, e.g., an electromechanical transducer element for use in vibration sensors, microphones, speakers, etc. (Herein, the term "piezoelectric element" refers to the above-mentioned structure and is meant to also cover such a structure which is used functionally as a pyroelectric element.) For example, conventional vibration sensors used heretofore have been those obtained by forming electrode films on both sides of a ceramic piezoelectric sheet of PZT, etc., and soldering lead wires to respective electrode films. However, these ceramic vibration sensors have several difficulties as follows. Thus, a ceramic vibration sensor does not fit a curved surface so that the accuracy of the measurement is lowered. Moreover, the measurable vibration frequency of such sensor is limited to 500 Hz or below, and it cannot be applied to measurement of a high frequency vibration reaching as high as 10 kHz or so as observed, e.g, in turbines. In contrast thereto, sensors using polymer piezoelectric elements are free from these difficulties and considered to be essentially suited.

However, there is a serious problem in using a polymer piezoelectric element as an electromechanical coupling agent that a structure of taking out lead wires from the electrodes disposed thereon is generally fragile and is not durable in continuous or successive use under vibration. For example, as one of the most fundamental ideas, it may be conceivable to solder lead wires to electrode films formed on a polymer piezoelectric film as has been explained with reference to the ceramic vibration sensor. This is, however, not appropriate because the polymer piezoelectric film per se is deteriorated due to heat. It is also conceivable to use an electroconductive bonding agent obtained by dispersing metal powder, carbon powder, etc., into various kinds of resinous binders to bond the lead wires to the electrode films. However, such an electroconductive bonding agent is relatively fragile and cannot possibly be durable against successive vibration applied in use as an electromechanical transducer element.

SUMMARY OF THE INVENTION

A principal object of the present invention is, in view of the above circumstances, to provide an electrode terminal structure excellent in durability for a polymer piezoelectric element.

The electrode terminal structure of the present invention has been developed to accomplish the above object and, more specifically, comprises a piezoelectric film element comprising a polymer piezoelectric film and a pair of electrode films formed on both surfaces of the polymer piezoelectic film, a conductor plate and an insulating plate disposed successively on one surface of and at a part in the neighborhood of the periphery of the piezoelectric film to form a stacked structure, and a continuous double-layered conductor plate sandwiching therebetween the stacked structure, the continuous double-layered conductor plate and the stacked structure sandwiched therebetween being pressure-bonded to each other to form an integral electrode terminal structure.

These and other objects, features and advantages of the present invetion will become more apparent upon a consideration of the following description of the preferred embodiments of the present invention taken in conjunction with the accompanying drawings wherein like parts are denoted by like reference numerals.

DESCRIPTION OF THE PREFERRED EMBODIMENTS

Figure 1:
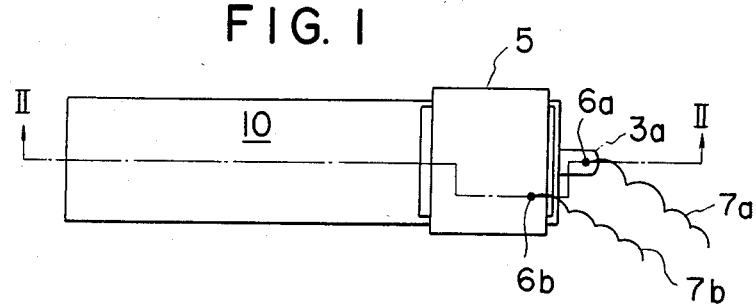
FIGS. 1 and 5 are plan views each showing an embodiment of the electrode terminal structure according to the present invention.
Figure 2:
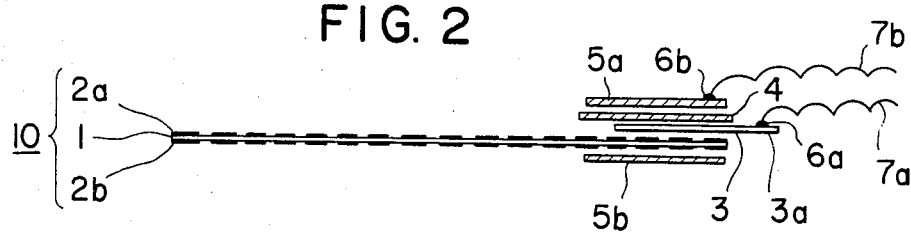
FIGS. 2 and 6 are sectional views taken along the line II—II in FIG. 1 and the line VI—VI in FIG. 5, respectively.

FIG. 1 is a plan view of an embodiment of the electrode terminal structure according to the present invention for use in a vibration sensor, and FIG. 2 is a sectional view in the thickness direction taken along the line II—II in FIG. 1. In this embodiment, electrode films 2a and 2b each formed by vapor deposition of Al, Ni, Cr, Au, etc., are disposed on both side of a polymer piezoelectric film 1 to form a piezoelectric element 10 which, as a whole, constitutes a sensor part of a vibration sensor. The piezoelectric element 10 has an entire shape of a strip and, for example, has sizes, of 15 mm in length, 3 mm in width and approximately 0.03 mm in thickness. Almost all of the thickness is occupied by the piezoelectric film 1 and each of the electrode films 2a and 2b has a thickness of the order of 500Å. On one surface of and in the neighborhood of one end (i.e., an example of a peripheral part of the strip-form piezoelectric element 10) are successively stacked or laminated a conductor plate 3 of Cu, etc., of, for example, 0.02 mm in thickness and an insulating plate 4 of, e.g., 0.5 mm in thickness comprising a sheet or film of a plastic such as Bakelite or polyethylene, glass, paper, etc. Further, the thus formed stacked portion or structure comprising the piezoelectric element 10, the conductor plate 3 and the insulating plate 4 is further sandwiched between layers 5a and 5b of a continuous double-layered conductor plate 5, and they are pressure-bonded to each other to form an integral structure. Lead wires 7a and 7b are bonded with solder at 6a and 6b, respectively, to a tongue 3a for bonding lead wire of the conductor plate 3 and the upper layer 5a of the continuous double-layered conductor plate 5, respectively. Thus, in this embodiment, the lead wire 7a is electrically connected to the upper face electrode film 2a of the piezoelectric element 10 through the conductor plate 3, while the lead wire 7b is connected to the lower face electrode film 2b of the piezoelectric element 10 through the double-layered conductor plate 5 (5a→5b).

Figure 3:
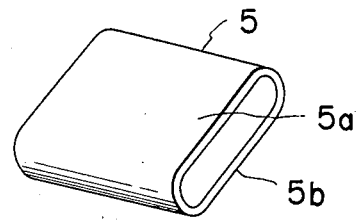
FIG. 3 is a perspective view showing an example of the continuous double-layered conductor plate.
Figure 4:
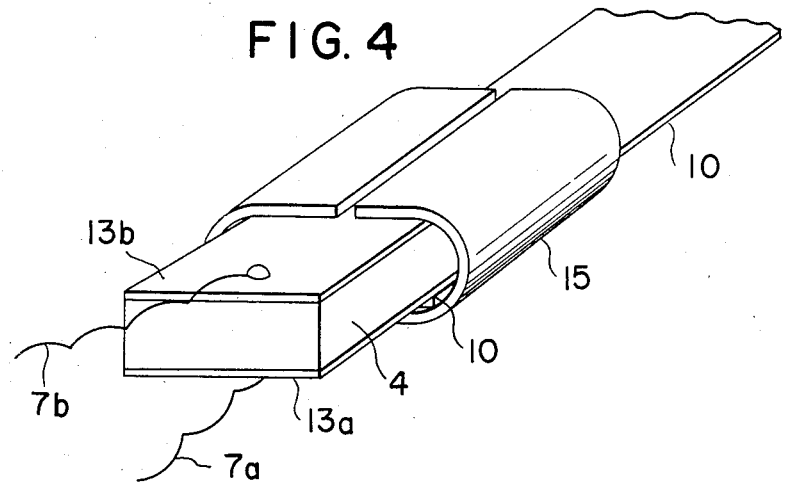
FIGS. 4 and 8 are partial perspective views each showing another embodiment of the electrode terminal structure according to the present invention.

The continuous double-layered conductor plate 5 comprises, e.g., a 0.2 mm-thick Cu plate. The double-layered conductor plate is in the form of a flattened tube of which a perspective view is shown in FIG. 3 in this embodiment, but may be in the form of a flattened tube with a central opening, i.e., a folded body 15 as obtained by folding a strip-form or rectangular conductor plate, as shown in FIG. 4. The embodiment of FIG. 4 is further provided with a conductor plate 13b for bonding a lead wire contacting the double-layered conductor plate 15 in addition to a conductor plate 13a, like the conductor plate 3 in the embodiment shown in FIGS. 1 and 2, which contacts the upper face electrode 2a of the strip-form piezoelectric element 10. The above-mentioned stacked structure or portion comprising the strip-form piezoelectric element 10, the conductor plate 3 (or the conductor plates 13a and 13b) and the insulating plate 4 is inserted into or sandwiched between the flattened tube 5 shown in FIG. 3 or the folded conductor plate 15 with a central opening shown in FIG. 4, and the resultant entire stacked structure is pressed at a pressure of the order of 0.1 kg/cm² by means of a press, whereby an integrally pressure-bonded structure as shown in FIGS. 1 and 2, or FIG. 4 is obtained. When comparison is made between the flattened tube 5 shown in FIG. 3 and the folded body 15 shown in FIG. 4, the former is superior in respect of soundness or durability of the electrode terminal structure obtained, while the latter is superior in respect of adaptability to simple production. The lead wires 7a and 7b can be soldered to the conductor plate 3 and the double-layered conductor plate 5, respectively. However, in order to facilitate the pressing as mentioned above, it is preferred to effect soldering of the lead wires after the pressure-bonding has been completed. In this instance, as the upper layer 5a of the double-layered conductor plate 5 is disposed above the piezoelectric element 10 by the medium of the conductor plate 3 and the insulating plate 4, there is almost no fear that the piezoelectric element is deteriorated due to heat of the soldering.

Figure 5:
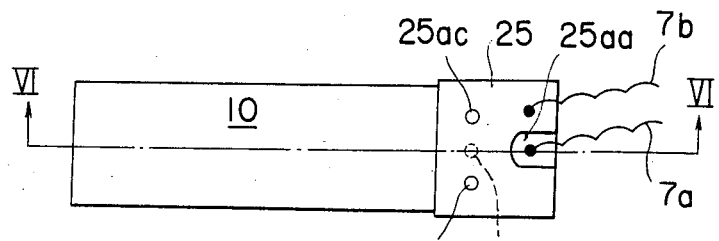
Figure 6:
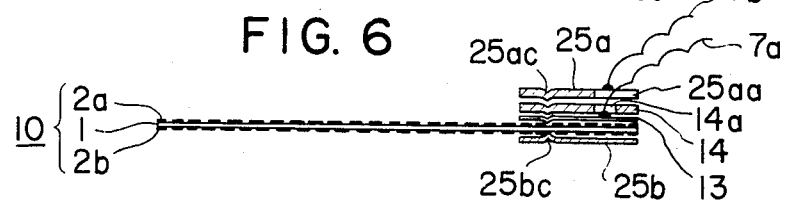
Figure 7:
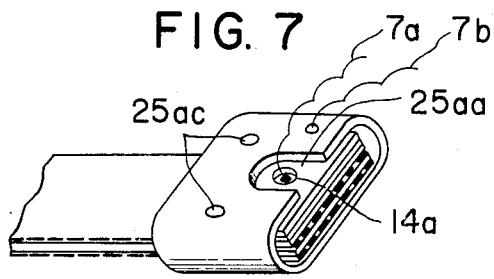
FIG. 7 is a partial perspective view of the embodiment shown in FIGS. 5 and 6.

FIGS. 5, 6 and 7 are a plan view, a sectional view in the thickness direction and a partial perspective view, respectively, of another embodiment of the electrode terminal structure according to the present invention. This embodiment of the electrode terminal structure is different from the structure shown in FIGS. 1 to 3 in that the upper layer 25a of the double-layered conductor plate 25 has a cutout portion 25aa, the insulating plate 14 has an aperture 14a, and a lead wire 7a is soldered to the conductor plate 13 contacting the upper face electrode 2a of the piezoelectric element at the part corresponding to the above-mentioned cutout 25aa and the aperture 14a. Because of these modifications, the lead wire-connecting tongue 3a shown in FIGS. 1 and 2 is removed, so that a simpler and sounder structure can be provided.

In the embodiment of FIGS. 5 to 7, the double-layered conductor plate 25 is further pressed locally by means of a punch, etc., from the upper and lower sides thereof. The thus formed projections 25ac and 25bc function to improve the contact between the conductor plate 13 and the upper face electrode film 2a, and between the lower layer 25b of the double-layered conductor plate 25 and the lower face electrode film 2b, and to enhance the pressure-bonding of the entire structure.

Figure 8:
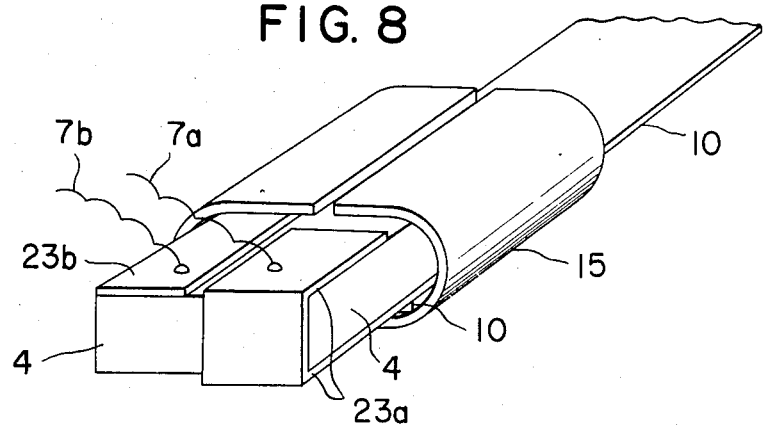

FIG. 8 is a partial perspective view of a still another embodiment of the electrode terminal structure according to the present invention. This embodiment is similar to the one shown in FIG. 4 but is different in that the piezoelectric element 10, a conductor plate 23a, the insulating plate 4 and a conductor plate 23b are stacked or laminated in the order named, and the thus stacked part or structure is sandwiched between the double-layered plate 15. The end portion of the conductor plate 23a is folded about the end of the insulating plate 4, and is held to align on substantially the same plane as, but is electrically isolated from, the conductor plate 23b. Because of these features, this embodiment has an advantage that the lead wires 7a and 7b can be taken out from neighboring parts and the connected wires can be easily treated.

In the above embodiments, explanation has been made with reference to a vibration sensor as a preferred example of application of the electrode terminal structure according to the present invention. However, the electrode terminal structure of the present invention with structures similar to those explained above is also applicable to other usages including those utilizing a monomorph structure such as a blood pressure sensor element, bimorphs comprising plural layers of polymer piezoelectric films or a laminate of a polymer piezoelectric film and another film, pyrosensors, etc.

As described hereinabove, according to the present invention, there is provided an electrode terminal structure for polymer piezoelectric element excellent in both electrical connection and mechanical durability, by using a continuous double-layered conductor plate as one of a pair of conductors respectively connected to electrode films formed on both sides of strip-form piezoelectric elements.

What is claimed is:

1. An electrode terminal structure for a piezoelectric element comprising:
   a piezoelectric film element comprising a polymer piezoelectric film having opposite first and second side surfaces and first and second electrode films respectively formed on said first and second side surfaces of the polymer piezoelectric film,
   a first conductor plate, an insulating plate and a second conductor plate disposed successively on said first electrode film and in the neighborhood of a periphery of the piezoelectric film element to form a stacked structure, and
   a continuous double-layered conductor plate sandwiching therebetween the stacked structure,
   the continuous double-layered conductor plate and the stacked structure sandwiched therebetween being pressure-bonded to each other to form an integral electrode terminal structure.

2. The electrode terminal structure according to claim 1, wherein said continuous double-layered conductor plate comprises a folded strip of conductor plate.

3. The electrode terminal structure according to claim 1, wherein said continuous double-layered conductor plate comprises a flattened tube of conductor plate.

4. The electrode terminal structure according to claim 1, wherein said continuous double-layered conductor plate is further pressed locally from at least one side thereof to the stacked structure.

5. The electrode terminal structure according to claim 1, wherein said first conductor plate disposed between the piezoelectric film and the insulating plate has a tongue for connecting a lead wire projecting from the stacked structure.

6. The electrode terminal structure according to claim 1, wherein said double-layered conductor plate and said insulating plate have an opening for introducing a lead wire to said first conductor plate between the insulating plate and the piezoelectric film element.

7. The electrode terminal structure according to claim 1, wherein one of said first and second conductor plates has a marginal portion folded about one end of the insulating plate so that said folded marginal portion is disposed so as to be in a same plane as, and electrically isolated from, the other of said first and second conductor plates.

8. The electrode terminal structure according to claim 1, wherein said piezoelectric film element is in the form of a strip having opposite ends, said stacked structure being formed at one of said opposite ends.

9. An electrode terminal structure for a piezoelectric element comprising:
 a piezoelectric film element comprising a polymer piezoelectric film having opposite first and second side surfaces and first and second electrode films respectively formed on said first and second side surfaces of the polymer piezoelectric film,
 a conductor plate and an insulating plate disposed successively on said first electrode film and in the neighborhood of a periphery of the piezoelectric film element to form a stacked structure, and
 a continuous double-layered conductor plate in the form of a flattened tube, sandwiching therebetween the stacked structure,
 the continuous double-layered conductor plate and the stacked structure sandwiched therebetween being pressure-bonded to each other to form an integral electrode terminal structure.

10. An electrode terminal structure for a piezoelectric element comprising:
 a piezoelectric film element comprising a polymer piezoelectric film having opposite first and second side surfaces and first and second electrode films respectively formed on said first and second side surfaces of the polymer piezoelectric film,
 a conductor plate and an insulating plate disposed successively on said first electrode film and in the neighborhood of a periphery of the piezoelectric film element to form a stacked structure, and
 a continuous double-layered conductor plate sandwiching therebetween the stacked structure,
 the continuous double-layered conductor plate and the stacked structure sandwiched therebetween being pressure-bonded to each other to form an integral electrode terminal structure, said double-layered conductor plate and said insulating plate having an opening for introducing a lead wire to said conductor plate between the insulating plate and the piezoelectric film element.

* * * * *